United States Patent [19]

Sawa

[11] Patent Number: 4,754,231
[45] Date of Patent: Jun. 28, 1988

[54] AUTOMATIC CONTROL CIRCUITRY FOR A SIGNAL POWER AMPLIFIER

[75] Inventor: Buntaro Sawa, Sagamihara, Japan

[73] Assignee: Kabushiki Kaisha Toshiba, Kanagawa, Japan

[21] Appl. No.: 19,842

[22] Filed: Feb. 27, 1987

[30] Foreign Application Priority Data

Feb. 28, 1986 [JP] Japan ................... 61-43305

[51] Int. Cl.$^4$ .............................................. H03G 3/20
[52] U.S. Cl. ................................... 330/279; 330/130; 330/141
[58] Field of Search ............... 330/129, 130, 131, 134, 330/141, 278, 279; 455/115, 116, 117, 126

[56] References Cited

U.S. PATENT DOCUMENTS 4,563,775  1/1986  Yokosuka ................. 330/279 X
4,570,127  2/1986  Tanimoto et al. ......... 330/279 X

FOREIGN PATENT DOCUMENTS 54-112111  9/1979  Japan.

Primary Examiner—Eugene R. LaRoche
Assistant Examiner—Steven J. Mottola
Attorney, Agent, or Firm—Banner, Birch, McKie & Beckett

[57] ABSTRACT

The present invention is directed to an automatic power control circuit for a signal power amplifier which maintains the output power to one of a plurality of output power levels. The output power level is controlled by an externally-generally level control signal which is used by a square wave signal generating circuitry for controlling the duty cycle of the generated square wave. The square wave is integrated by a filter network to produce a reference voltage level. The output voltage level of the RF amplifier is compared with the reference voltage level, and the difference between the two signals is used to control a drive circuit for generating the proper control voltage for controlling the RF amplifier so that the desired output power level is maintained.

15 Claims, 2 Drawing Sheets

AUTOMATIC CONTROL CIRCUITRY FOR A SIGNAL POWER AMPLIFIER

BACKGROUND OF THE INVENTION

1. Technical Field

The present invention is directed to control circuitry for controlling the output of a signal power amplifier. More specifically, the present invention is directed to feedback control circuitry for controlling the output level of a signal power amplifier to one of a plurality of output levels.

2. Background Information

Generally, signal power amplifiers typically used in radio apparatus are operated at a specific output power level, and such power amplifiers are adjusted to that specific output power level during the manufacturing process of the specific signal power amplifier. Additionally, applications exist which require signal power amplifiers to have the capability of outputting one of a plurality of output power levels, as, for example, in mobile telephone systems. Specifically, in mobile telephone systems, eight discreet power levels are typically required.

Generally, mobile telephone systems employ a multi-channel access system having communication channels between a base station and mobile units consisting of control channels and voice channels. The mobile unit, when initiating a call, generates a call-initiation signal and a dial-signal, representing the called party's telephone number, which gets transmitted over the control channel. Upon receipt by the base station, the base station transmits a response signal, acknowledging the calling party, and a channel signal, designating to the calling party which voice channel to employ. In this way, a communication link between the mobile unit and the called party is established.

When the mobile unit is in transit, the received radio frequency (RF) signal level from the mobile unit to the base station is proportional to the distance between the mobile unit and base station. In order to prevent channel interference, it is preferable that the received RF signal level be constant. For this reason, the base station transmits a level control signal to the mobile unit for use by the mobile unit in adjusting its output RF signal power in accordance therewith. Specifically, the level control signal varies the RF signal power output level to one of eight different output power levels.

Automatic power control circuitry for performing this function is well known in the art. For example, as shown in Japanese laid-open application No. 54-112,111 assigned to the NEC Corportation, and herein incorporated by reference, the output RF signal power level produced is determined by one of eight different reference voltages. These reference voltages are used by a differential amplifier for comparing the chosen reference voltage value to the feedback voltage of the output of the power amplifier. These reference voltages are applied selectively to the differential amplifier by an analogue multiplexer, the individual reference voltages being generated via resistance networks having variable resistors connected to the analogue multiplexer. The level control signal is used to select the appropriate reference voltage supplied to the differential amplifier by controlling the analogue multiplexer.

The prior art system of employing variable resistors for generating the plurality of voltage levels used by the RF amplifier to adjust its output power level has inherant limitations. For example, the variable resistors must be adjusted accurately during manufacture of the resistence networks and subsequent adjustments required due to age and component degradation is difficult. Additionally, should a reference voltage be required to be adjusted for other reasons, such adjustment would also be difficult. Further, the analogue multiplexer is both expensive and large, making any automatic power control circuitry employing analogue multiplexers both costly and large.

SUMMARY OF THE INVENTION

Accordingly, it is an object of the present invention to provide an improved automatic power control circuitry for a signal power amplifier which can adjust its output power levels automatically and conveniently.

It is another object of the present invention to provide an improved automatic power control circuitry for a signal power amplifier that is able to be manufactured at both low cost and which requires less size than that required by the prior art.

In accordance with the above objects, the present invention is directed to a feedback control circuit for maintaining the magnitude of an output signal from a signal power amplifier at one of a plurality of levels selected by a level control signal. The level control signal is generated by an independent souce, such as the base station in a mobile telephone system. The output level of the signal power amplifier is responsive to a drive signal, supplied to the signal power amplifier by a driving amplifier. The driving amplifier varies the magnitude of the drive signal in response to a drive control signal generated by a differential amplifier as the difference between the feedback voltage (proportional to the output voltage from the signal power amplifier) and the desired signal power amplifier output.

The desired output is generated by a square wave signal generating circuit, which receives the level control signal and uses it to control the duty cycle of a square wave. The square wave is intergrated over time by a filter network and input to the differential amplifier for comparison with the actual output of the amplifier as fed back to the differential amplifier. The filtered square wave appears to the differential amplifier substantially as a DC reference voltage. The difference between this reference voltage and the feedback voltage output of the amplifier is what is used by the differential amplifier as the drive control signal to the driving amplifier for producing the drive signal which controls the output level of the signal power amplifier to the appropriate output level.

DETAILED DESCRIPTION OF THE PREFERRED EMBODIMENTS

Figure 1:
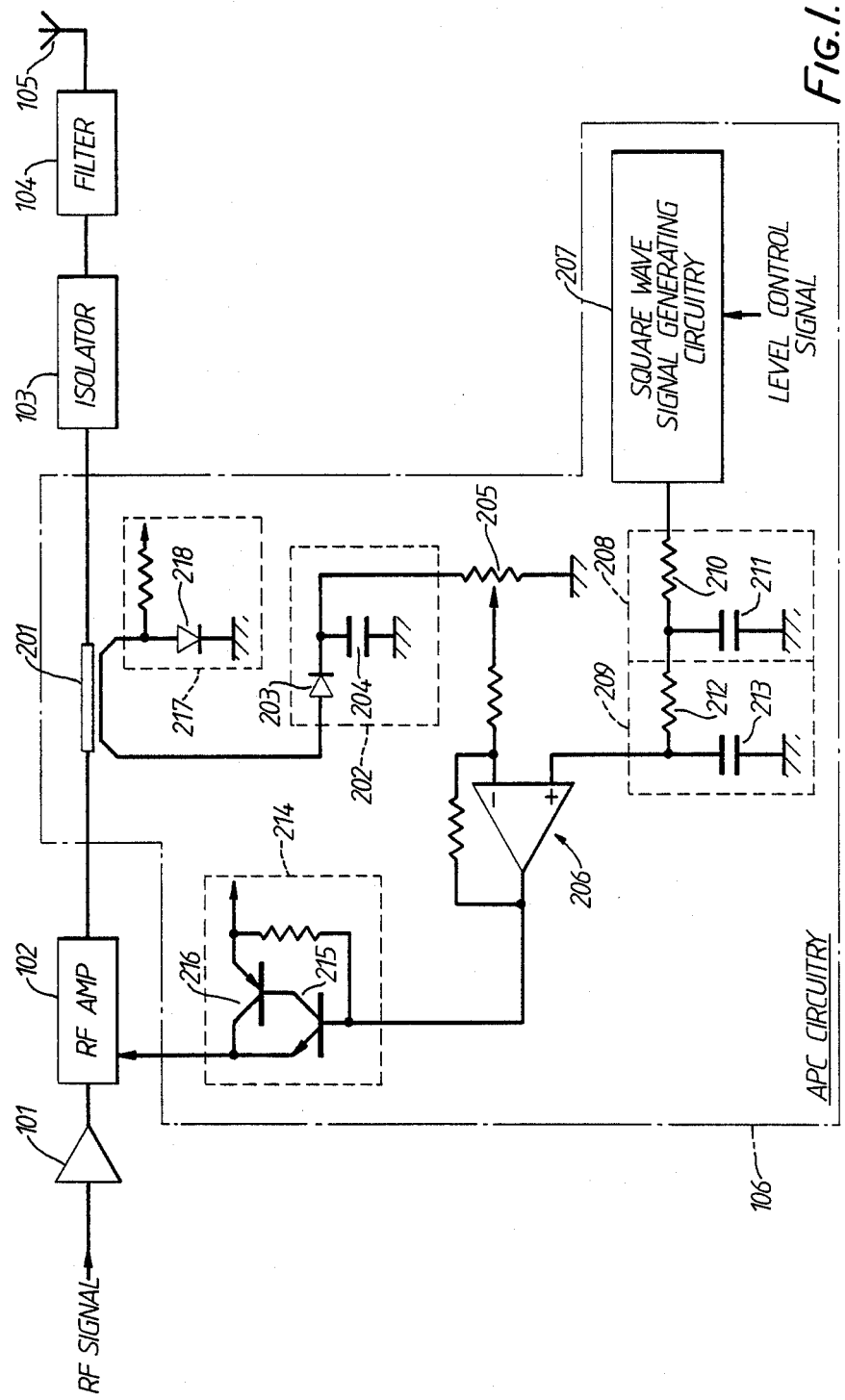
FIG. 1 is a block diagram of an RF signal power amplifier including the automatic power control circuitry of the present invention shown in the environment of a mobile telephone's mobile unit.

Turning now to FIG. 1, a signal power amplifier is shown with automatic power control (APC) circuitry of the present invention in the environment of a mobile telephone system. Typically, the radio transmitter includes an RF signal power amplifier to amplify a modulated RF signal radiated by an antenna. The signal power amplifier of FIG. 1 preferably includes two cascaded blocks of amplification, low level RF amplifier 101 and final RF amplifier 102.

The RF signal input to low level RF amplifier 101 is typically a modulated 10 mW signal, amplifier, in the preferred embodiment, to at least 100 mW for driving final RF amplifier 102. The output of amplifier 102 is coupled to antenna 105 by isolator 103 and filter 104. The output power level developed by a final RF amplifier 102 is responsive to the drive signal applied by APC circuitry 106.

APC circuitry 106 receives the output of RF amplifier 102 and varies the drive signal applied to amplifier 102 for maintaining the output of the signal power amplifier at the predetermined magnitude. This level is determined by the level control signal, which, in the preferred embodiment, is generated by the base station of a mobile telephone system. In the preferred embodiment, the level is used to select one of eight different output power levels.

The output from amplifier 102 is received by APC circuitry 106 by directional coupler 201, and is applied to rectifier 202. The anode terminal of diode 203 is biased to a predetermined voltage by bias circuit 217. Diode 218 also is used for temperature compensation for diode 203 of rectifier 202. The voltage across capacitor 204, portional to the output voltage from amplifier 102, is applied to the inverting terminal of differential amplifier 206 via potentiometer 205. In the preferred embodiment, potentiometer 205 is set during manufacture to produce the desired power output level from amplifier 102.

The level control signal, generated by an external source, is received by square wave signal generating circuitry 207 and used thereby to output a power level (PL) signal which is a square wave having one of a predetermined number of duty cycles. In the preferred embodiment, circuitry 207 is capable of generating a square wave having one of eight different duty cycles. The PL signal is integrated by low pass filters 208 and 209 which produce a substantially d.c. reference voltage signal input to the non-inverting terminal of differential amplifier 206. In the preferred embodiment, resistors 210 and 212 have resistance values of 6.6 k and 3.3 k, respectively, while capacitors 211 and 213 have capacitance values of 0.02 uF.

Differential amplifier 206 compares the output voltage from rectifier 202 with the reference voltage from low pass filters 208 and 209, outputting a signal proportional to the difference thereto. The output from differential amplifier 206 is applied to the base terminal of transistor 215 in drive circuit 214. The drive signal output from transistor 215, proportional to the output voltage from differential amplifier 206, is preferably applied to the collector of an amplifying transistor (not shown) of RF amplifier 102. In operation, differential amplifier 206 varies the drive signal from transistor 216 to keep the two voltage signals input thereto substantially at the same magnitude. Thus, the magnitude of the output signal from RF amplifier 102 is maintained at the power level determined by the level control signal.

Figure 2A:
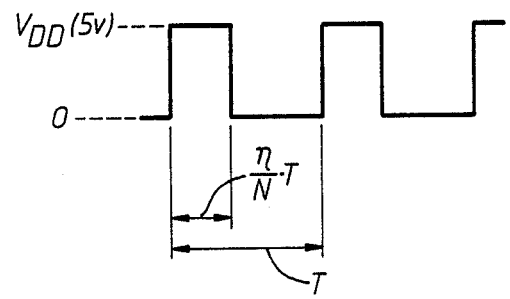
FIG. 2a illustrates the square wave generated by the square wave signal generating circuitry shown in FIG. 1.

Turning now to FIG. 2a, the power level (PL) signal generated by the square wave signal generating circuitry of FIG. 1 is now described. The PL signal is a square wave having a period T, a HIGH level of period $(n/N)*T$ and LOW period during period T of $(1-n/N)*T$. The parameters of n, N and T are variable and can be selected by the user according to the required application. In the preferred embodiment, because the square wave signal generating circuitry of FIG. 1 is comprised of digital components, the value of N, representing the step increments available, is equal to 256. There are eight different values of n, representing the number of user-selected power level signals.

Generally, the input/output characteristics of RF amplifier 102 is non-linear. Therefore, the values for n must be chosen in a manner which takes into account the amplifier's non-linearity characteristics. In the preferred embodiment, eight different power levels are available having a maximum output power level of 3 watts (34.8 dBm) with steps of 4 dB between subsequent power levels. As is well known to those skilled in the art, 1.58 is substantially the factor required for steps of 4 dB ($20 \log 1.58 = 4$ dB). For a 34.8 dBm maximum power level, the value for n is chosen at its maximum (i.e., 256), with the magnitude of the reference voltage signal preferably equal to the square wave signal generating circuitry power supply voltage $V_{DD}$ (i.e., 5 volts). The remaining seven values of n are chosen such that the RF output power levels are 4 dB apart (i.e., reference voltage steps of 1/1.58). Given the above parameters, n is chosen as the closest integer value calculated by the equation $(n*V_{REF})/V_{DD}$. In the preferred embodiment, the eight different theoretical values for n for the eight different power levels are shown in Table 1, below. (The actual values for n are varied to compensate for actual system dynamics, such as diode non-linearity.)

TABLE 1

| POWER LEVEL | RF OUTPUT | $V_{REF}$ | n |
|---|---|---|---|
| $PL_0$ | 34.8 dBm | 5.00 v | 256 |
| $PL_1$ | 30.8 | 3.15 | 162 |
| $PL_2$ | 26.8 | 1.99 | 102 |
| $PL_3$ | 22.8 | 1.26 | 64 |
| $PL_4$ | 18.8 | 0.79 | 41 |
| $PL_5$ | 14.8 | 0.50 | 26 |
| $PL_6$ | 10.8 | 0.37 | 16 |
| $PL_7$ | 6.8 | 0.20 | 10 |

Other values will, however, be readily apparent to one skilled in the art, as dictated by amplifier specifications and required application. (In the preferred embodiment, when the mobile unit is not in operation, the power level signal is at 0 volts.)

Figure 2B:
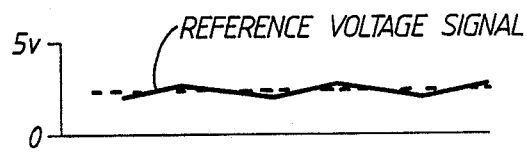
FIG. 2b illustrates the output of the filter network shown in FIG. 1 which is used as the reference voltage signal at the non-inverting input terminal of the differential amplifier shown in FIG. 1.

When the duty cycle of the power level signal is constant, the reference voltage signal from low pass filters 208 and 209 is substantially a constant d.c. value, as shown in FIG. 2b. The value of the reference voltage, as explained above, is substantially a direct current voltage having the value of $(n/N)*V_{DD}$, wherein $V_{DD}$ is the square wave circuitry supply voltage.

Figure 3:
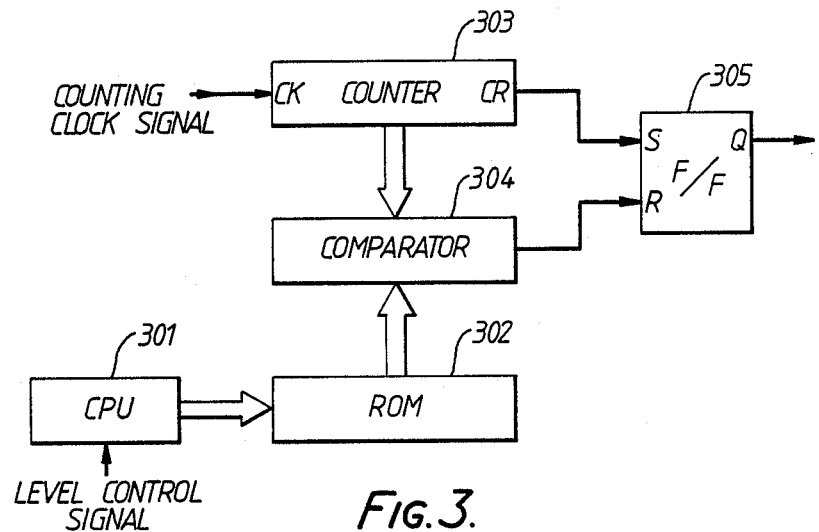
FIG. 3 is a block diagram of the preferred embodiment of the square wave signal generating circuitry shown in FIG. 1.

Turning now to FIG. 3, the block diagram of the square wave signal generating circuitry of FIG. 1 is shown, and includes read-only memory (ROM) 302 for storing the binary representation of the eight different values for n. Central processing unit 301 receives the level control signal and generates the appropriate address so that the value of n is input to comparator 304. Counter 303, enabled by CPU 301 upon receipt of the level control signal, operates as a recirculating counter, counting the clock signals generated by a clock generating circuit (not shown) to the value of N (i.e., the period of the square wave), generating a carry (CR) signal and reinitializing once the value of N is reached. The carry signal is input to the SET input of flip-flop 305, causing the Q output to go high. Comparator 304 compares the count of counter 303 with the value of n received from ROM 302 and generates an output signal used as the RESET signal to flip-flop 305 upon coincidence, causing the flip-flop output to go low. Accordingly, the output of flip-flop 305 is the square wave signal shown in FIG. 2a such that the SET signal produces the square wave's leading edge while the RESET signal produces the square wave's trailing edge.

The present invention inherently includes advantages not found in the prior art. For example, as the reference voltage levels are determined by the value of the integers stored in ROM 302, it is very easy to modify the reference voltages. Further, ROM 302 could store all N values for n, letting an N-valued level control signal choose the desired square wave.

Additionally, as the power level signal from square wave signal generating circuitry 207 is zero volts when the mobile unit is not in the transmit mode, the output of RF amplifier 102 is also zero volts. Thus, RF amplifier 102 does not output any signal when the mobile unit is not in its transmit mode. Conversely, it has been found that prior art amplifiers typically generate low level signals when they are not transmitting.

Further, prior art RF amplifiers typically produce an overshoot output signal at the point when the reference voltage from the analogue multiplexer is changed to a different level. This is due, in large part, because the different reference voltages are coupled directly to the differential amplifier. This overshoot does not occur in the present invention due to the relatively slow reaction time of filters 208 and 209. Thus, a change in the power level signal does not cause a sudden change in the difference signal generated from differential amplifier 206. Accordingly, the overshoot is substantially damped.

Although illustrative embodiments of the present invention have been described in detail with reference to the accompanying drawings, it is to be understood that the invention is not limited to those precise embodiments. Various changes or modifications may be effected therein by one skilled in the art without departing from the scope or spirit of the invention.

For example, square wave signal generating circuity 207 may comprise a programmable processor which generates the requisite square waves by software control. Furthermore, any other type of wave form may be generated by a signal generated by a signal generating circuit similar to square wave signal generating circuitry 207 to achieve the same results. Also, a temperature detection circuitry could be included which adjusts the duty cycle of the generated power level signal in order to compensate for variations in temperature which effect rectifier 202 should it be desired to remove diode 218 of bias circuitry 217. Furthermore, directional coupler 201 may include an amplifier for amplifying the output of the sensed voltage in applications where the output level of RF amplifier 102 is small.

What I claim as my invention is:

1. In a signal power adjusting circuit capable of outputting one of a plurality of output power levels in accordance with a drive control signal, an automatic power control circuit operatively connected to an output of the signal power adjusting circuit for generating the drive control signal in accordance with an externally-generated level control signal, said automatic power control circuit comprising:
    coupling means having an input and an output, the input coupled to the output of the signal power adjusting circuit for detecting the output level of the signal power adjusting circuit;
    voltage indicating means connected to the output of said coupling means for receiving the detected output level and outputting a voltage proportional to the detected output level;
    means for generating a variable wave in accordance with the externally-generated level control signal;
    amplitude means connected to said variable wave generating means for outputting a signal related to the amplitude of the variable wave as it varies over a predetermined period of time; and
    comparison means having first and second input terminals, the output of said voltage indicating means connected to the first input terminal, the output of said amplitude means connected to the second input terminal, said comparison means for generating a signal related to the signals at its first and second input terminals, and for amplifying the generated signal as the drive control signal to drive the signal power adjusting circuit at one of the plurality of output power levels.

2. The automatic power control circuit of claim 1, said variable wave having a period and one of a plurality of average values over the period, said average value selected in accordance with the externally-generated level control signal.

3. The automatic power control circuit of claim 2, said period being a predetermined and substantially constant for each of said variable waves.

4. The automatic power control cuircuit of claim 3, said variable wave being square wave having a predetermined period and one of a plurality of duty cycles, said duty cycle selected in accordance with the externally-generated level control signal.

5. The automatic power control circuit of claim 1, said amplitude means comprising an integrator to output a signal proportional to the average value of the variable wave as it varies over a predetermined period of time.

6. The automatic power control circuit of claim 1,
    said variable wave being a square wave having a predetermined period and one of a plurality of duty cycles, said duty cycle selected in accordance with the externally-generated level control signal; and
    said amplitude means comprising an integrator to output a signal proportional to the average value of the square wave over the predetermined period.

7. The automatic power control circuit of claim 6, said comparison means comprising a differential amplifier, said differential amplifier generating a difference signal related to the signals at its first and second input terminals, and for amplifying the difference signal as the drive control signal to drive the signal power adjusting circuit at one of the plurality of output power levels.

8. The automatic power control circuit of claim 1, said comparison means comprising a differential amplifier, said differential amplifier generating a difference signal relating to the signals at its first and second input terminals, and for amplifying the difference signal as the drive control signal to drive the signal power adjusting circuit at one of the plurality of output power levels.

9. In a signal power adjusting circuit capable of outputting one of a plurality of output power levels in accordance with a drive control signal, an automatic power control circuit operatively connected to an output of the signal power adjusting circuit for generating the drive control signal in accordance with an externally-generated level control signal, said automatic power control circuit comprising:

coupling means having an input and an output, the input coupled to the output of the signal power adjusting circuit for detecting the output level of the signal power adjusting circuit;

voltage indicating means having an input and an output, the input connected to the output of said coupling means for receiving the detected output level and outputting a voltage proportional to the detected output level;

square wave signal generator having an input and an output to output a square wave having a predetermined period and one of a plurality of duty cycles, said duty cycle selected in accordance with the externally-generated level control signal;

integrator having an input and an output, the input connected to the output of said square wave signal generator to receive said square wave and to output a reference voltage proportional to the average value of the square wave; and differential amplifier means having first and second input terminals, the output of said voltage indicating means connected to the first input terminal, the output of said integrator connected to the second input terminal, said differential amplifier means for generating a difference signal proportional to the voltage difference at its first and second input terminals, and for amplifying the difference signal as the drive control signal to drive the signal power adjusting circuit at one of the plurality of output power levels.

10. The automatic power control circuit of claim 9, said voltage indicating means comprising:

rectifier circuit connected to said coupling means to output a voltage proportional to the detected output level;

bias circuit connected to said coupling means to bias said rectifier circuit to a predetermined voltage; and variable potentiometer connected between the output of said rectifier circuit and ground potential, the potentiometric terminal connected to the first input of said differential amplifier.

11. The automatic power control circuit of claim 10, said bias circuit further including means for compensating said rectifier circuit for changes in temperature.

12. The automatic power control circuit of claim 9, said square wave signal generator comprising:

a control device to receive the externally-generated level control signal and to generate an address signal in response thereto;

oscillator controllably enabled by said control device to output clock signals;

counter connected to said oscillator to receive and count said clock signals and output a SET signal whenever said counter value equals the predetermined value of the period of said square wave;

comparator connected to said counter to output a RESET signal whenever said counter value equals a predetermined value indicative of the selected duty cycle;

memory to store a plurality of data representing the plurality of duty cycles, said memory outputting one of the data as the predetermined value to said comparator in accordance with the address signal generated by said control device; and trigger means connected to said counter and said comparator to output the leading edge of the square wave upon receipt of the SET signal and to output the trailing edge of the square wave upon receipt of the RESET signal.

13. The automatic power control circuit of claim 9, said integrator comprising a low-pass filter network.

14. The automatic power control circuit of claim 13, said low-pass filter network comprising a second-order RC network.

15. The automatic power control circuit of claim 14, said second-order RC network including first and second resistors and first and second capacitors, said first and second capacitors having substantially the same capacitance values.

* * * * *